US010154234B2

(12) United States Patent
Liu et al.

(10) Patent No.: US 10,154,234 B2
(45) Date of Patent: Dec. 11, 2018

(54) IMAGE SENSOR WITH PERIPHERAL 3A-CONTROL SENSORS AND ASSOCIATED IMAGING SYSTEM

(71) Applicant: OmniVision Technologies, Inc., Santa Clara, CA (US)

(72) Inventors: Chengming Liu, San Jose, CA (US); Jizhang Shan, Los Gatos, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 0 days.

(21) Appl. No.: 15/071,934

(22) Filed: Mar. 16, 2016

(65) Prior Publication Data

US 2017/0272708 A1    Sep. 21, 2017

(51) Int. Cl.
| | |
|---|---|
| *H04N 5/235* | (2006.01) |
| *H04N 9/04* | (2006.01) |
| *H04N 9/73* | (2006.01) |
| *H04N 5/232* | (2006.01) |
| *H01L 27/146* | (2006.01) |

(52) U.S. Cl.
CPC ....... *H04N 9/045* (2013.01); *H01L 27/14621* (2013.01); *H01L 27/14627* (2013.01); *H04N 5/2351* (2013.01); *H04N 5/23212* (2013.01); *H04N 9/735* (2013.01)

(58) Field of Classification Search
CPC ........ H01L 27/14627; H01L 27/14621; H04N 5/23212; H04N 5/2254; H04N 9/045; H04N 5/23267; H04N 5/2258; H04N 5/2351; H04N 5/2354; G03B 7/093; G06T 2207/10024; G06T 2207/10144; G09G 2360/144

See application file for complete search history.

(56) References Cited

U.S. PATENT DOCUMENTS

| | | |
|---|---|---|
| 4,471,228 A | 9/1984 | Nishizawa et al. |
| 4,956,715 A | 9/1990 | Okino et al. |
| 5,917,464 A | 6/1999 | Stearns |

(Continued)

OTHER PUBLICATIONS

Lee et al., Auto White Balance Using Chromatic Coordinates of Detected Human Faces, ITC-CSCC, 2008, http://www.ieice.org/proceedings/ITC-CSCC2008/pdf/p1257_P1-65.pdf, 4 pages.

*Primary Examiner* — Chia Wei A Chen
(74) *Attorney, Agent, or Firm* — Lathrop Gage LLP

(57) ABSTRACT

An imaging system includes a primary imager and plurality of 3A-control sensors. The primary imager has a first field of view and includes a primary image sensor and a primary imaging lens with a first optical axis. The primary image sensor has a primary pixel array and control circuitry communicatively coupled thereto. The plurality of 3A-control sensors includes at least one of a peripheral imager and a 3A-control sensor. The peripheral imager, if included, has a second field of view including (i) at least part of the first field of view and (ii) a phase-difference auto-focus (PDAF) sensor and a peripheral imaging lens, the PDAF sensor being separate from the primary image sensor. The 3A-control sensor, if included, is separate from the primary pixel array and communicatively connected to the control circuitry to provide one of auto-white balance and exposure control for the primary pixel array.

20 Claims, 9 Drawing Sheets

(56) References Cited

U.S. PATENT DOCUMENTS

| | | | |
|---|---|---|---|
| 6,404,851 B1 | 6/2002 | Possin et al. | |
| 7,081,956 B1* | 7/2006 | Lalovic | G03F 7/70091 356/400 |
| 8,792,048 B2* | 7/2014 | Takeuchi | H04N 5/23212 348/345 |
| 9,549,115 B1* | 1/2017 | Baldwin | H04N 5/23212 |
| 2002/0039137 A1 | 4/2002 | Harper et al. | |
| 2004/0223075 A1* | 11/2004 | Furlan | H04N 5/2254 348/363 |
| 2006/0022118 A1 | 2/2006 | Morii et al. | |
| 2008/0143858 A1* | 6/2008 | Kusaka | H04N 5/3696 348/294 |
| 2009/0096783 A1* | 4/2009 | Shpunt | G01B 11/25 345/419 |
| 2011/0074989 A1 | 3/2011 | Fossum et al. | |
| 2011/0187859 A1* | 8/2011 | Edelson | H04N 5/2351 348/143 |
| 2012/0154637 A1* | 6/2012 | Hara | H04N 5/23212 348/239 |
| 2013/0057740 A1 | 3/2013 | Takaiwa | |
| 2013/0182156 A1* | 7/2013 | Moriya | H04N 5/335 348/294 |
| 2014/0043501 A1* | 2/2014 | Lee | H04N 9/735 348/224.1 |
| 2014/0063049 A1* | 3/2014 | Armstrong-Muntner | G03B 9/00 345/619 |
| 2015/0009361 A1 | 1/2015 | Liu et al. | |
| 2016/0065870 A1* | 3/2016 | Pyeoun | H04N 5/369 348/302 |
| 2016/0309564 A1* | 10/2016 | Jia | H05B 37/0218 |
| 2017/0090149 A1* | 3/2017 | Galor Gluskin | H04N 5/23212 |
| 2017/0344939 A1* | 11/2017 | Linton | G01S 5/0294 |
| 2018/0080815 A1* | 3/2018 | Nayak | G01J 1/0474 |
| 2018/0081093 A1* | 3/2018 | Wang | G02B 5/0294 |
| 2018/0087759 A1* | 3/2018 | Mathews | F21V 23/045 |
| 2018/0136116 A1* | 5/2018 | Takashima | A01G 7/00 |

* cited by examiner

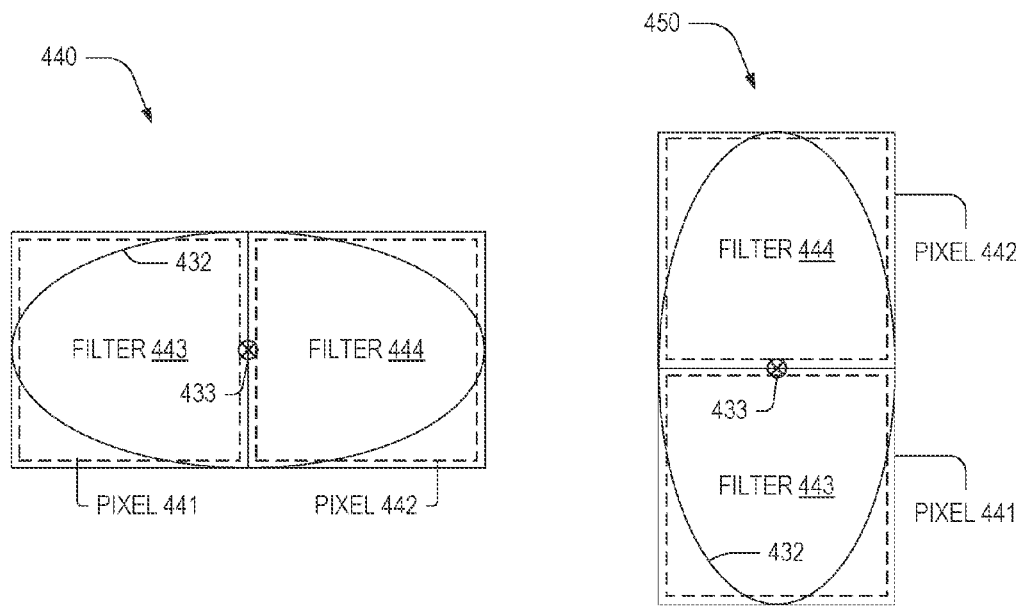
FIG. 4A
FIG. 4B
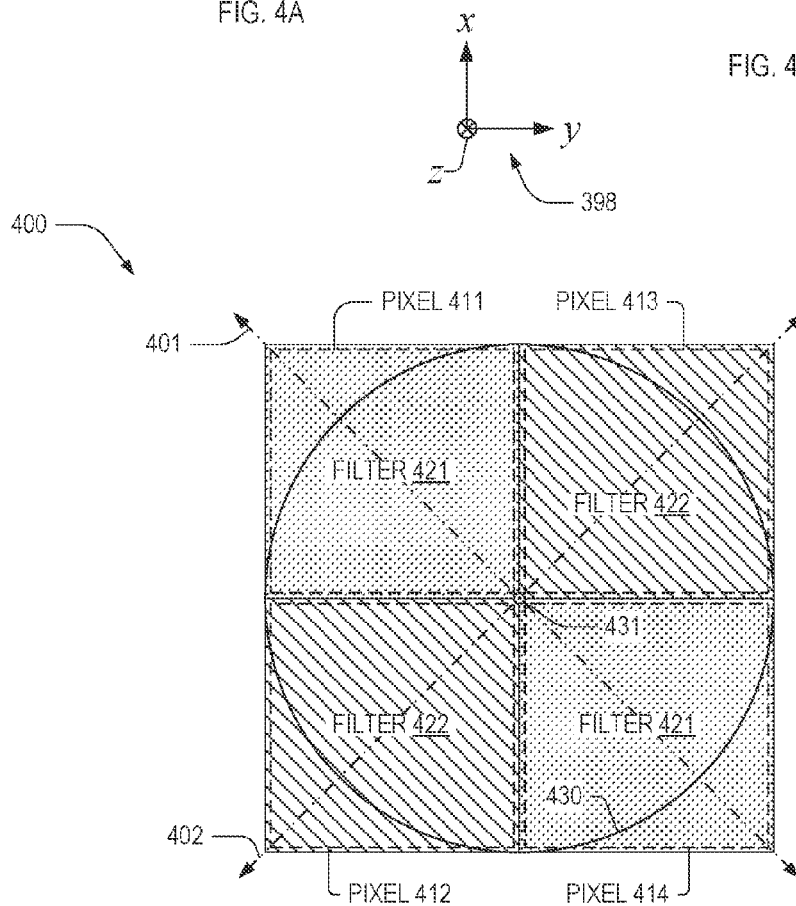
FIG. 4C

IMAGE SENSOR WITH PERIPHERAL 3A-CONTROL SENSORS AND ASSOCIATED IMAGING SYSTEM

BACKGROUND

High-volume consumer products such as mobile devices and motor vehicles now include at least one digital camera. For example, FIG. 1 shows a mobile device 190 having a camera module 180 integrated therein. Camera module 180 includes an image sensor 100 beneath an imaging lens 170. Mobile device 190 also includes an image signal processor (ISP) 192 communicatively coupled to camera module 180. ISP 192 is capable of performing three tasks related to ensuring image quality: auto exposure control, auto white balance, and auto focus. Together, these three capabilities are known as 3A control.

FIG. 2 is a plan view of an image sensor 200, which is an example of image sensor 100. Image sensor 200 includes a pixel array 210 formed of a plurality of pixels 211. Selected pixels 211' function as a type of 3A-control sensor. That is, each pixel 211' has a dedicated 3A-control function: one of auto exposure control, auto white balance, and auto focus.

SUMMARY OF THE INVENTION

A drawback of image sensor 200 is that pixels 211' do not contribute a valid pixel value for image data captured by image sensor 200. While interpolation of pixel values from pixels 211 neighboring pixel 211' may partially remedy this issue, the resulting image still has artifacts. The following embodiments address this problem.

In one embodiment, an image sensor includes a primary pixel array, control circuitry communicatively coupled to the primary pixel array, and a 3A-control sensor is disclosed. The 3A-control sensor is separate from the primary pixel array and is communicatively connected to the control circuitry to provide at least one of auto-white balance and exposure control for the primary pixel array.

In another embodiment, an image sensor includes a primary pixel array, control circuitry communicatively coupled to the primary pixel array, and a PDAF sensor separate from the primary pixel array and in a plane parallel to the primary pixel array is disclosed.

In another embodiment, an imaging system includes a primary imager and plurality of 3A-control sensors is disclosed. The primary imager has a first field of view and includes a primary image sensor and a primary imaging lens with a first optical axis. The primary image sensor has a primary pixel array in a first plane, and control circuitry communicatively coupled to the primary pixel array. The plurality of 3A-control sensors includes at least one of a peripheral imager and a 3A-control sensor. The peripheral imager, if included, has (i) a second field of view including at least part of the first field of view and (ii) a phase-difference auto-focus (PDAF) sensor and a peripheral imaging lens. The PDAF sensor is separate from the primary image sensor and in a plane parallel to the first plane. The peripheral imaging lens has a second optical axis parallel to the first optical axis. The 3A-control sensor, if included, is separate from the primary pixel array and is communicatively connected to the control circuitry to provide one of auto-white balance and exposure control for the primary pixel array.

BRIEF DESCRIPTION OF THE FIGURES

FIGS. 4A, 4B, and 4C show plan views of exemplary symmetric multi-pixel phase-difference detectors of the FIG. 3 image sensor, in an embodiment.

DETAILED DESCRIPTION OF THE EMBODIMENTS

Figure 1:
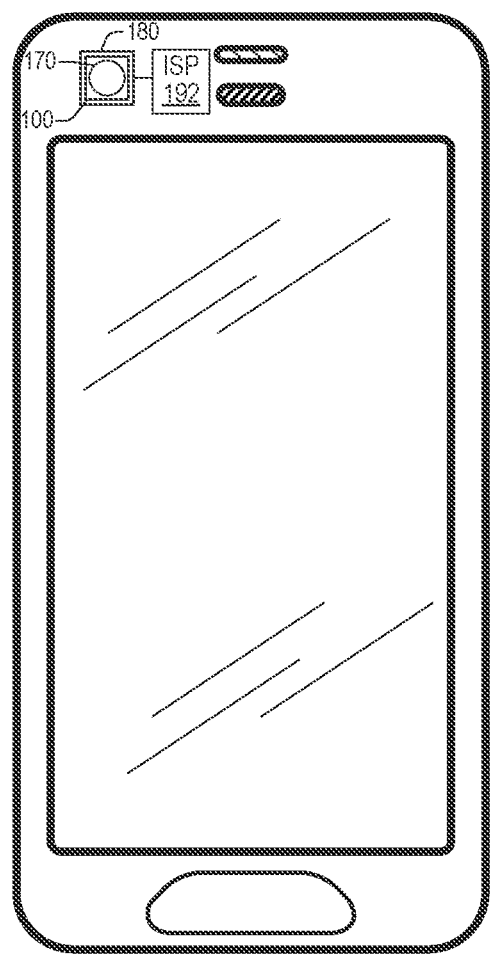
FIG. 1 shows a prior art mobile device having a camera module integrated therein, wherein the camera module includes an image sensor.
Figure 2:
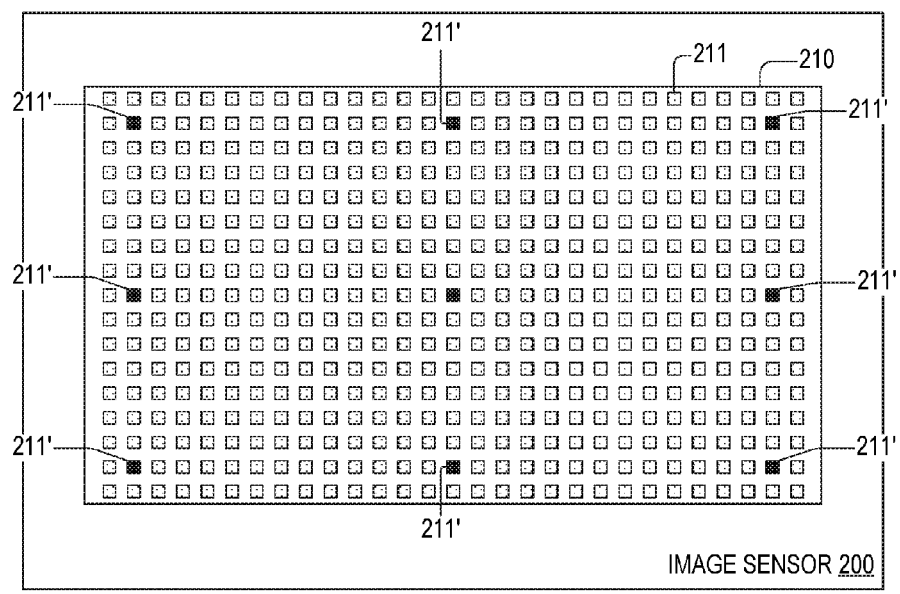
FIG. 2 is a plan view of a prior art image sensor that is an example of the FIG. 1 image sensor.
Figure 3:
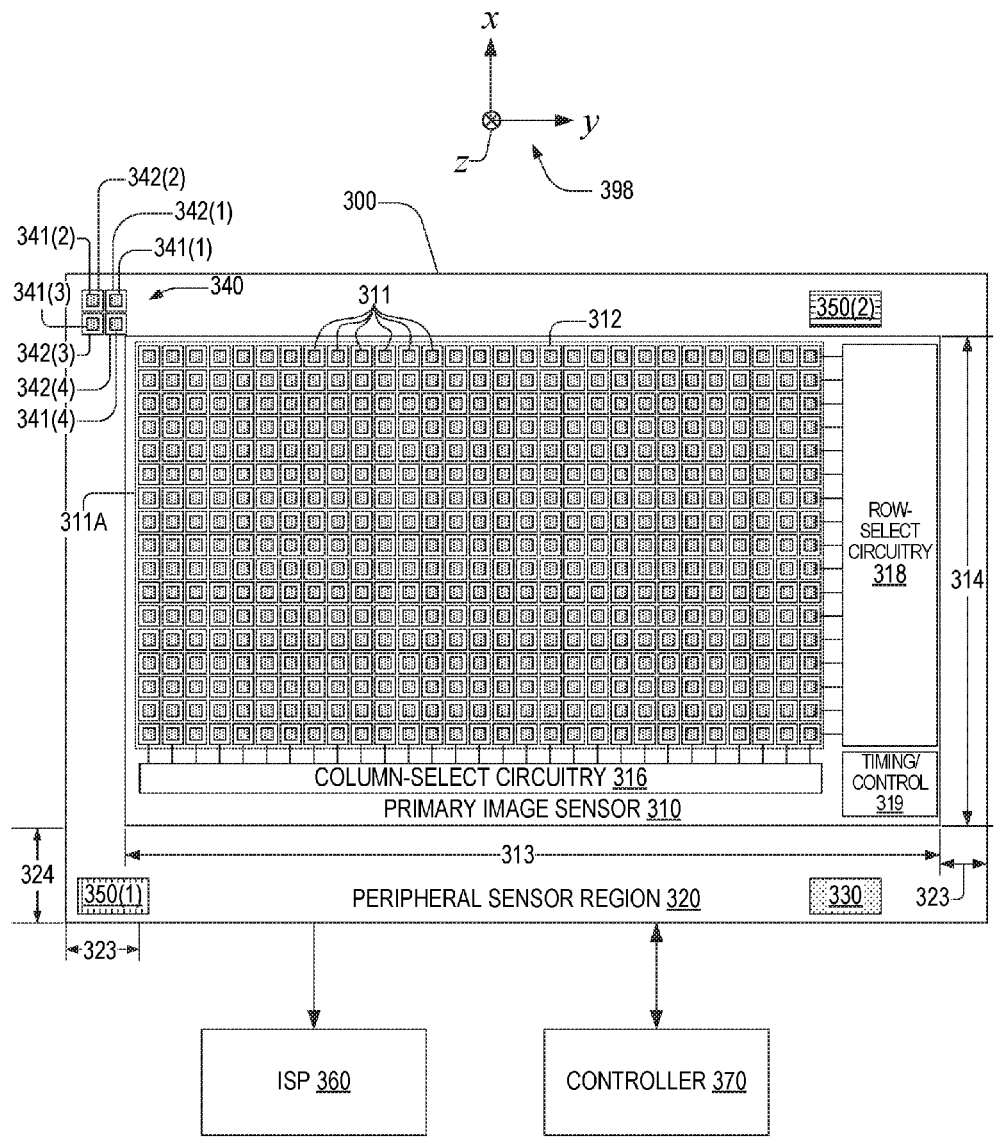
FIG. 3 is a plan view of an image sensor with peripheral 3A-control sensors that is compatible for use in a camera module such as shown in FIG. 1, in an embodiment.

FIG. 3 is a plan view of an image sensor 300 with peripheral 3A-control sensors that is compatible for use in a camera module (for example instead of camera module 180 within mobile device 190, FIG. 1). Image sensor 300 includes a primary image sensor 310 having a plurality of image-sensor pixels 311 that form a primary pixel array 311A. Image sensor 300 is for example a complementary metal-oxide semiconductor (CMOS) image sensor.

Primary image sensor 310 also includes an array of color filters 312 each aligned to a respective image-sensor pixel 311 (for clarity of illustration only a few pixels 311 and filters 312 are labeled in FIG. 3). Each color filter 312 has a transmission spectrum corresponding to one of a plurality of transmission spectra. In an embodiment, each of the plurality of transmission spectra corresponds to the transmission spectrum of one of a red color filter, a blue color filter, a green color filter, a cyan color filter, a magenta color filter, a yellow color filter, and a panchromatic color filter. Primary image sensor 310 may also include an array of microlenses, not shown, each aligned to a respective image-sensor pixels 311, such that a color filter 312 is between each microlens and image-sensor pixels 311.

Since the transmission spectrum of a pixel's color filter is a feature that distinguishes it from neighboring pixels, a pixel is referred to by filter type. For example, a red color filter has a transmission spectrum corresponding to portion of the electromagnetic spectrum corresponding to red light. Accordingly, a red pixel includes a red filter. Herein, the transmission of a pixel refers to the transmission spectrum of its color filter.

Image sensor 300 includes a peripheral sensor region 320 having therein one or more optical sensors referred to generally herein as 3A-control sensors. 3A-control sensors within sensor region 320 may be formed on the same substrate, for example a silicon substrate, as primary image sensor 310. Each 3A-control sensor is capable of being electrically connected to a same circuit board as primary image sensor 310.

In the embodiment of FIG. 3, peripheral sensor region 320 includes an infrared (IR) sensor 330, a pixel-array sensor 340, and phase-difference auto-focus (PDAF) sensors 350(1) and 350(2). Sensors 330, 340, and 350 are examples of 3A-control sensors. Image sensor 300 need not include each of sensors 330, 340, and 350, though image sensor 300 includes at least one of sensor 330, sensor 340, sensor 350(1), and sensor 350(2). Image sensor 300 may include more than one of the same type of sensor in peripheral sensor region 320, for example one or more of (a) multiple IR sensors 330, (b) multiple pixel-array sensors 340, (c) multiple PDAF sensors 350(1), and (d) multiple PDAF sensors 350(2).

In the embodiment of image sensor 300 shown in FIG. 3, sensors 330, 340, 350(1), 350(2) are located within peripheral sensor region 320 adjacent to corners of primary image sensor 310. Sensors 330, 340, 350(1), 350(2) may be located elsewhere within peripheral sensor region 320 without departing from the scope hereof. Primary image sensor has a width 313 and a height 314. Peripheral sensor region has a width 323 and a height 324. Width 323 and height 324 may be larger or smaller than as illustrated in FIG. 3 without departing from the scope hereof. For example, width 323 is less than half of width 313 and height 324 is less than half of height 314.

Infrared (IR) sensor 330 is for example an IR sensor that includes one or more image-sensor pixels 311 with an IR transmission filter thereon.

Pixel-array sensor 340 for example includes four pixels 341(1-4) each having a respective color filter 342(1-4) thereon, of which one is panchromatic. Pixels 341 may be identical to image-sensor pixels 311 of primary image sensor 310. Pixel-array sensor 340 may include more than four pixels 341 without departing from the scope hereof. For example, pixel-array sensor 340 may itself be a CMOS image sensor.

Each color filter 342 has a transmission spectra corresponding to one of the plurality of transmission spectra of color filters 312. For example, when each color filter 312 is one of a red, green, blue, and panchromatic filter, color filter 342(1) is red, color filter 342(2) is green, color filter 342(3) is blue, and color filter 342(4) is panchromatic.

Primary image sensor 310 and a sensor within peripheral sensor region 320 may be part of the same package. In an embodiment, primary image sensor 310 and at least one of IR sensor 330, pixel array sensor 340, and PDAF sensors 350 are each CMOS sensors packaged in a same package, such as a chip-on board or flip-chip package.

Image-sensor pixels 311 and a sensor within peripheral sensor region 320 may be formed on same substrate. In an embodiment, image-sensor pixels 311 and at least one of IR sensor 330, pixel array sensor 340, and PDAF sensors 350 are each CMOS sensors formed on the same semiconductor substrate. In a different embodiment, image-sensor pixels 311 and a sensor within peripheral sensor region 320 are formed on a different substrate.

Primary image sensor 310 includes column select circuitry 316, row-select circuitry 318, and timing-and-control circuitry 319, hereinafter control circuitry 319. Each image-sensor pixel 311 is electrically connected to both column select circuitry 316 and row-select circuitry 318. In an embodiment, image-sensor pixels 311 are the only photosensitive elements electrically connected to circuitry 316 and 318, such that neither circuitry 316 and 318 are directly connected to a sensor in peripheral sensor region 320.

Auto White Balance

At least one of IR sensor 330 and pixel-array sensor 340 may be used for auto-white balance. FIG. 3 shows image sensor 300 communicatively coupled to an image signal processor (ISP) 360, which may be incorporated into image sensor 300 as an on-chip ISP for example. In an embodiment, ISP 360 receives image data from primary image sensor 310 and data from at least one of IR sensor 330 and pixel-array sensor 340 to perform auto-white balance transformation on image data from primary image sensor 310.

In an auto-white balance (or color balance) transformation, raw pixel values R, G, and B of red, green, and blue pixels respectively are multiplied by respective gain factors $k_R$, $k_G$, and $k_B$ to yield white-balanced pixel values $R_{wb}$, $G_{wb}$, and $B_{wb}$: $R_{wb}=k_R R$, $G_{wb}=k_G G$, and $B_{wb}=k_B B$. More generally, white-balanced pixel values $R_{wb}$, $G_{wb}$, and $B_{wb}$ may each be proportional to their respective gain value and raw pixel value. For example, $R_{wb}=c_R k_R R$, where $c_R$ is a compensation factor. In the following example, $k_G=1$ such that $G_{wb}=G$. Gain factors $k_R$ and $k_B$ may be computed in real time from pixel outputs $\langle R \rangle$, $\langle G \rangle$, and $\langle B \rangle$ of pixel-array sensor 340 as described below.

In an exemplary mode of operation, pixel-array sensor 340 functions as an auto-white balance sensor. Color filters 342(1-4) of pixel-array sensor 340 are red, green, blue, and panchromatic, respectively, and are above respective pixels 341(1-4). Each color filter 312 of primary image sensor 310 is one of a color filter 342(1-4). Pixel outputs $\langle R \rangle$, $\langle G \rangle$, and $\langle B \rangle$ are proportional to pixel values of pixels 341(1), 341(2), and 341(3), respectively. Pixel array sensor 340 may include a plurality of pixels 341 of each color, such that $\langle R \rangle$, $\langle G \rangle$, and $\langle B \rangle$ are average pixel values of pixels 341 having the corresponding color filter. Gain factors $k_R$ and $k_R$ are related to pixel outputs $\langle R \rangle$, $\langle G \rangle$, and $\langle B \rangle$ as follows:

$$k_R = \frac{\langle G \rangle}{\langle R \rangle} \text{ and } k_B = \frac{\langle G \rangle}{\langle B \rangle}.$$

These gain factors are valid for applying auto-white balance to outputs of image-sensor pixels 311 because each type of color filter 312 corresponds to a type of color filter 342.

Auto Exposure Control

At least one of IR sensor 330 and pixel-array sensor 340 may provide auto-exposure control. In an exemplary mode of operation, image sensor 300 is communicatively coupled to a controller 370, which may be incorporated into image sensor 300, for example, within control circuitry 319. In an embodiment, controller 370 receives image data from primary image sensor 310 and at least one of IR sensor 330 and pixel-array sensor 340 to determine an appropriate contrast setting of image-sensor pixels 311 of primary image sensor 310. Controller 370 sends contrast-setting data to image sensor 300, which control circuitry 319 uses to set contrast values of image-sensor pixels 311.

Image $I_m$ captured by image sensor 310 is characterized by an exposure setting $E_m$ and a gain setting $G_m$ of image sensor 310. Auto exposure control can provide an appropriate target contrast of image $I_m$, where contrast is the product of exposure $E_m$ and gain $G_m$.

Image sensor 300 is calibrated by imaging a reference object, such as a planar gray object with a reference luminance $C_0$ on image sensor 310 to form a reference image (m=0). One or more panchromatic pixels of pixel-array sensor 340, pixel 341(4) for example, detects reference luminance $C_0$ at diffused light transmitted by diffuser 640. The product of exposure setting $E_0$, gain setting $G_0$, and reference luminance $C_0$ is computed, which is constrained to be a constant $A_0=E_0 G_0 C_0$ in subsequent images (m>0) captured by primary image sensor 310. For an image $I_m$, an appropriate contrast $E_m G_m$ may be determined using constant $A_0$ and measured luminance $C_m$. That is, $E_m G_m C_m = A_0$, or contrast $$E_m G_m = \frac{A_0}{C_m}.$$

Auto Focus

PDAF sensors 350(1-2) may be configured for focusing images of objects with edges oriented in different directions. For example, PDAF sensor 350(1) is configured to focus objects with horizontal edges and PDAF sensor 350(2) is configured to focus objects with vertical edges, where horizontal and vertical correspond to the y and x directions respectively of a coordinate system 398. PDAF sensors 350 may include a single pixel or multiple pixels.

Examples of PDAF sensors 350 include symmetric multi-pixel phase-difference detectors disclosed in U.S. patent application Ser. No. 14/819,021, which is incorporated herein by reference in its entirety. FIGS. 4A, 4B, and 4C show plan views of exemplary symmetric multi-pixel phase-difference detectors 440, 450, and 400, respectively. Symmetric multi-pixel phase-difference detectors 440, 450, and 400 are examples of PDAF sensors 350. Herein, symmetric multi-pixel phase-difference detectors 440 and 450 are also referred to as horizontal dual-pixel phase-difference detector 440 and vertical dual-pixel phase-difference detector 450, respectively.

Horizontal dual-pixel phase-difference detector 440 includes two horizontally-adjacent phase-detection pixels 441 and 442, color filters 443 and 444, and a microlens 432. Microlens 432 is above phase-detection pixels 441 and 442, which respectively have color filter 443 and 444 thereon. Microlens 432 has an optical axis 433. In an embodiment, pixels 441 and 442 form a planar array to which optical axis 433 is orthogonal, as shown. Pixels 441 and 442 may be identical to image-sensor pixels 311 of primary image sensor 310.

As oriented in FIG. 4A, phase-detection pixels 441 and 442 may be denoted as a left-pixel and a right-pixel respectively. Pixels 441 and 442 are referred to as phase-detection pixels because they each lack a dedicated microlens above them; rather, each pixel 441 and 442 is beneath a common microlens 432. For clarity of illustration, the dashed boxes denoting pixels 441 and 442 are smaller than boxes denoting respective color filters 443. Color filters 443 and 444 may have a same transmission spectrum, and may be formed of a single continuous piece of material.

While microlens 432 is shown to have an oval cross-section in the plan view of FIGS. 4A and 4B, it may have a differently-shaped cross-section without departing from the scope hereof. For example, microlens 432 may have a rectangular cross-section in a plane parallel to the x-y plane of coordinate system 398 such that it completely covers both pixels 441 and 442. Microlens 432 may include a portion of a spherical surface, an ellipsoidal surface, or an aspheric surface.

Vertical dual-pixel phase-difference detector 450 is horizontal dual-pixel phase-difference detector 440 rotated by ninety degrees such that it is oriented parallel to the x-axis of coordinate system 398 and phase-detection pixels 441 and 442 are vertically-adjacent. As oriented in FIG. 4B, phase-detection pixels 441 and 442 may be denoted as a bottom-pixel and a top-pixel respectively.

In an embodiment, phase-detection pixels 441 and 442 lack masking elements designed to prevent light from reaching photosensitive regions thereof. That is, phase-detection pixels 441 and 442 have no additional masking elements relative to image-sensor pixels 311 of primary image sensor 310.

Figure 5:
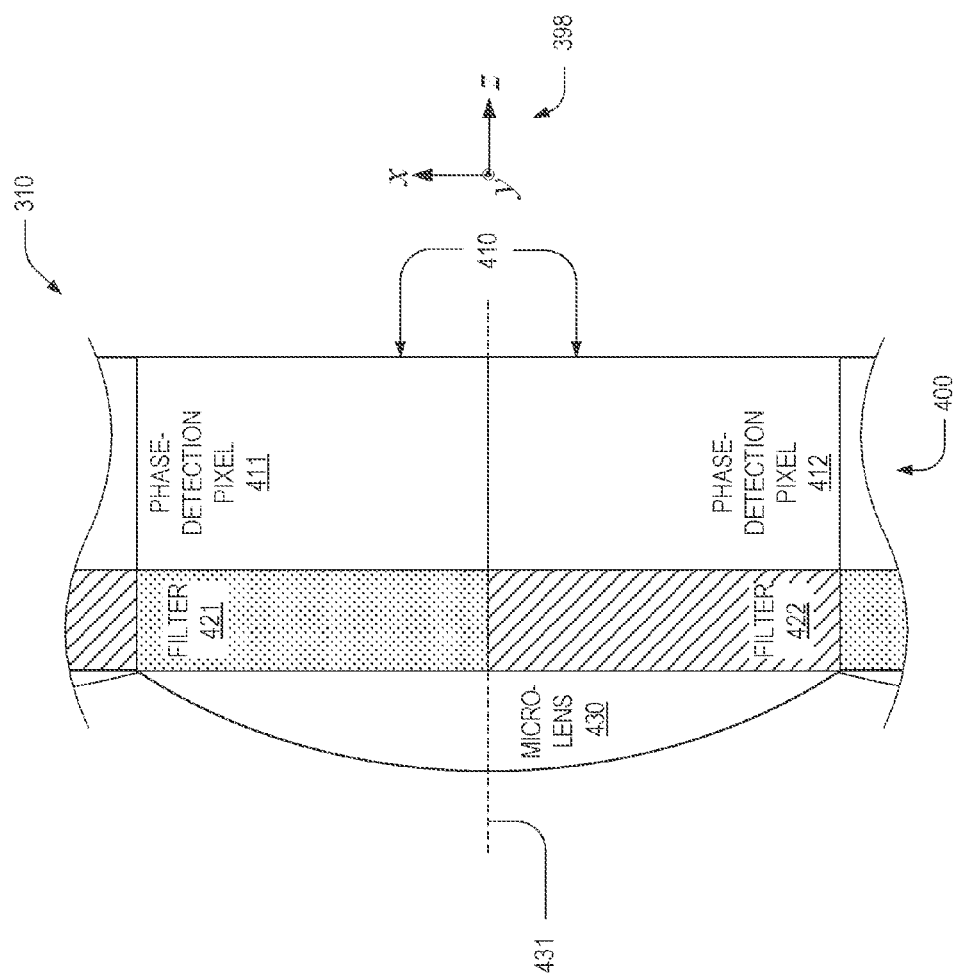
FIG. 5 is a cross-sectional view of the symmetric multi-pixel phase-difference detector of 4C.

FIG. 4C and FIG. 5 show a plan view and a cross-sectional view, respectively, of one symmetric multi-pixel phase-difference detector 400. FIGS. 4A and 5 are best viewed together in the following description. A microlens 430 is above phase-detection pixels 411,412,413, and 414, each having either color filter 421 or 422 thereon. For clarity of illustration, the dashed boxes denoting pixels 411-414 are smaller than boxes denoting respective color filters 421 and 422.

Microlens 430 is positioned above phase-detection pixels 411-414 such that its optical axis 431 is centered therebetween. Pixels 411-414 are referred to as phase-detection pixels because they each lack a dedicated microlens above; rather, pixels 411-414 are beneath a common microlens 430. Pixels 411-414 may be identical to image-sensor pixels 311 of primary image sensor 310.

Color filters 443,421, and 422 each transmit a specified range or ranges of visible electromagnetic radiation to its associated underlying pixel. For example, visible color filters based on primary colors have pass bands corresponding to the red, green, or blue (RGB) region of the electromagnetic spectrum, and are referred to as red filters, green filters, and blue filters respectively. Visible color filters based on secondary colors have pass bands corresponding to combinations of primary colors, resulting in filters that transmit either cyan, magenta, or yellow (CMY) light, and are referred to as cyan filters, magenta filters, and yellow filters, respectively. A panchromatic color filter (Cl) transmits all colors of visible light equally.

Symmetry planes 401 and 402 may be perpendicular to each other, contain optical axis 431, and intersect each other at optical axis 431. Phase-detector pixels 411-414 may have a common back-plane 410 such that they form a planar array. Optical axis 431 may intersect back-plane 410 at a 90-degree angle such that optical axis 431 is perpendicular to pixel array 102. Symmetric multi-pixel phase-difference detectors 400 have reflection symmetry with respect to both symmetry planes 401 and 402. Symmetric multi-pixel phase-difference detector 400 also has two-fold rotational symmetry. Table 1 shows fourteen exemplary color filter configurations of symmetric multi-pixel phase-difference detectors 400, where R, G, B, C, M, Y, and Cl denote red, green, blue, cyan, magenta, yellow, and panchromatic color filters respectively. In any of the fourteen configurations, the two color filters may be switched without departing from the scope hereof. For example, in configuration (c), color filter 421 is a green filter and color filter 422 is a red filter.

TABLE 1

Exemplary color filter configurations of symmetric multi-pixel phase-difference detectors

| filter configuration | (a) | (b) | (c) | (d) | (e) | (f) | (g) | (h) | (i) | (j) | (k) | (l) | (m) | (n) |
|---|---|---|---|---|---|---|---|---|---|---|---|---|---|---|
| color filter 421 | G | Cl | G | G | Cl | Cl | Cl | R | C | C | M | Cl | Cl | Cl |
| color filter 422 | G | Cl | R | B | R | G | B | B | Y | M | Y | C | M | Y |

Phase-detection pixels 411 and 412 may each be viewed as left pixels and together be denoted as a left-pixel pair. Phase-detection pixels 413 and 414 may each be viewed as right pixels and together be denoted as a right-pixel pair. Phase-detection pixels 411 and 413 may each be viewed as top pixels and together be denoted as a top-pixel pair. Phase-detection pixels 412 and 414 may each be viewed as bottom pixels and together be denoted as a bottom-pixel pair.

In symmetric multi-pixel phase-difference detectors 400, pixels 411-414 and their associated color filters 421 and 422 form a two-dimensional two-by-two pixel array. In an embodiment, symmetric multi-pixel phase-difference detectors 400 may include more than four pixels, e.g., eight pixels in a two-by-four array or sixteen pixels in a four-by-four array.

In an embodiment, phase-detection pixels 411-414 lack masking elements designed to prevent light from reaching photosensitive regions thereof. That is, phase-detection pixels 411-414 have no additional masking elements relative to non-phase-detection pixels of image sensor 100.

PDAF sensors 350 may be other than a symmetric multi-pixel phase-difference detectors disclosed in U.S. patent application Ser. No. 14/819,021. For example, a sensor 350 may have phase-detection pixels that have an opaque mask (or equivalently a shield) that blocks light from reaching part or all of a photodiode region beneath a pixel's microlens. Such partially-masked (partially-shielded) pixels enable distinguishing light passing through the imaging objective from different directions.

Figure 6:
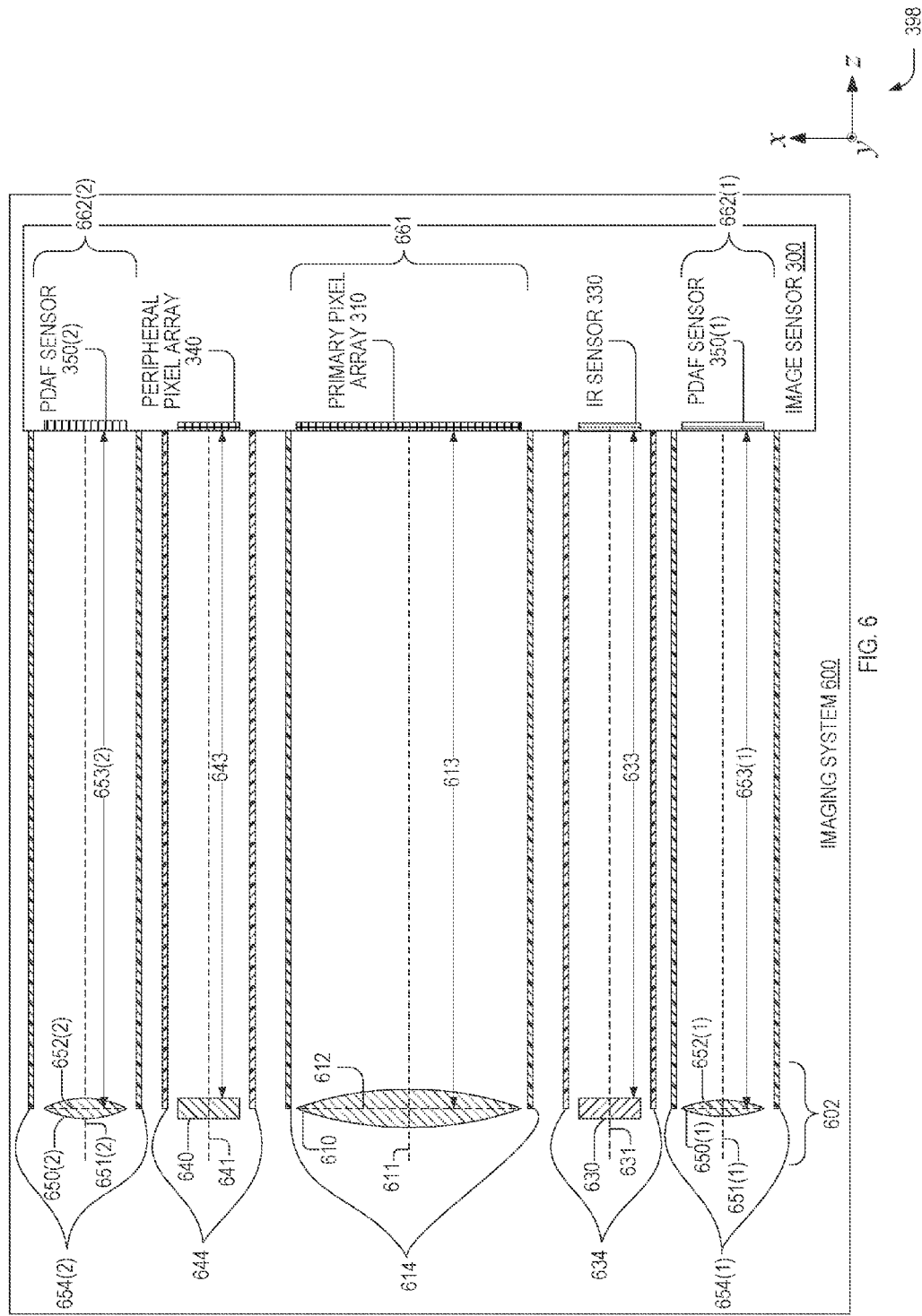
FIG. 6 is a schematic diagram of an imaging system that includes the FIG. 3 image sensor with peripheral 3A-control sensors, in an embodiment.

FIG. 6 is a schematic diagram of an imaging system 600 that includes image sensor 300 with peripheral 3A-control sensors. Imaging system 600 also includes a lens region 602 with a primary imaging lens 610, transmissive diffusers 630 and 640, and peripheral imaging lenses 650(1-2). Lenses 610, 650(1), and 650(2) have optical axes 611, 651(1), and 651(2), respectively. Optical axes 611, 651(1), and 651(2) are mutually parallel, though they deviate from being mutually parallel without departing from the scope hereof.

Image sensor 300 includes primary image sensor 310, PDAF sensor 350(1), and PDAF sensor 350(2), which are aligned with lenses 610, 650(1), and 650(2), respectively. In an embodiment, at least one of lenses 610, 650(1), and 650(2) are axially aligned with respective centers of primary image sensor 310, PDAF sensor 350(1), and PDAF sensor 350(2).

Lens 610 and primary image sensor 310 form a primary imager 661. Lenses 650 and respective PDAF sensors 350 form peripheral imagers 662 each having a field of view that include at least part of the field of view of primary imager 661.

Primary imaging lens 610, transmissive diffusers 630 and 640, and peripheral imaging lenses 650(1-2) are shown as being collinear for clarity of illustration. Similarly, sensors 310, 330, 340, and 350 are shown as being collinear for clarity of illustration. However, an embodiment of imaging system 600 may be configured as shown such that FIG. 6 represents a cross-sectional view of imaging system 600.

Primary imaging lens 610 has a principal plane 612 located at an adjustable distance 613 from primary image sensor 310. Peripheral imaging lenses 650(1-2) have respective principal planes 652(1-2) located at respective adjustable distances 653(1-2) from PDAF sensors 350(1-2). At least one of distances 653 may equal adjustable distance 613 such that primary imaging lens 610 and at least one of lenses 650(1-2) are coplanar. Adjustable distance 613 may change by moving one or both of image sensor 300 and imaging lens 610 parallel to the z-axis of coordinate system 398. In an embodiment, imaging lens 610 moves independently of at least one of lenses 650 and diffusers 630 and 640. In another embodiment, lenses 610, 650(1), and 650(2) move together such that distances 613, 653(1), and 653(2) remain equal, or have a functional relationship for any focus position of lens 610. In still another embodiment, at least one of a working distance, focal length and f-number peripheral lenses 650 differ from respective values primary imaging lens 610 by less than ten percent.

Transmissive diffusers 630 and 640 have axes 631 and 641 orthogonal to their respective geometric centers. IR sensor 330 and pixel-array sensor 340 are aligned with transmissive diffusers 630 and 640, respectively, such that IR sensor 330 and pixel-array sensor 340 detect normal-incident light on transmissive diffusers 630 and 640, respectively. In an embodiment, at least one of transmissive diffusers 630 and 640 is axially aligned with respective centers of IR sensor 330 and pixel-array sensor 340. Transmissive diffusers 630 and 640 are located at respective distances 633 and 643 from IR sensor 330 and pixel-array sensor 340. At least one of distances 633 may equal distance 613. Transmissive diffusers 630 and 640 are for example formed of sand-blasted glass, grit-polished glass, a crystalline substrate or another type of transmissive diffuser known in the art. Transmissive diffuser 630 is for example formed of a material with high near-IR transmission such as calcium fluoride, magnesium fluoride, or zinc selenide.

Imaging system 600 optionally includes baffles to prevent stray light transmitted by a transmissive element of lens region 602 from being detected by a sensor of image sensor 300 not aligned with the transmissive element. Each baffle 654(1), 634, 614, 644, and 654(2) spans at least part of distances 653(1), 633, 613, 643, and 653(2), respectively.

As discussed above, pixel-array sensor 340 may provide auto-exposure control. Conventional auto exposure control uses selected pixels of an image sensor to detect luminance. This method is vulnerable to producing inaccurate luminance values when the image on the image sensor includes a bright spot that saturates a selected pixel. By comparison, in imaging system 600, diffuser 640 spatially diffuses light incident thereon, which reduces the likelihood that panchromatic pixels of pixel-array sensor 340 become saturated. This reduced likelihood of saturation results in a faster and more accurate auto exposure control.

Figure 7:
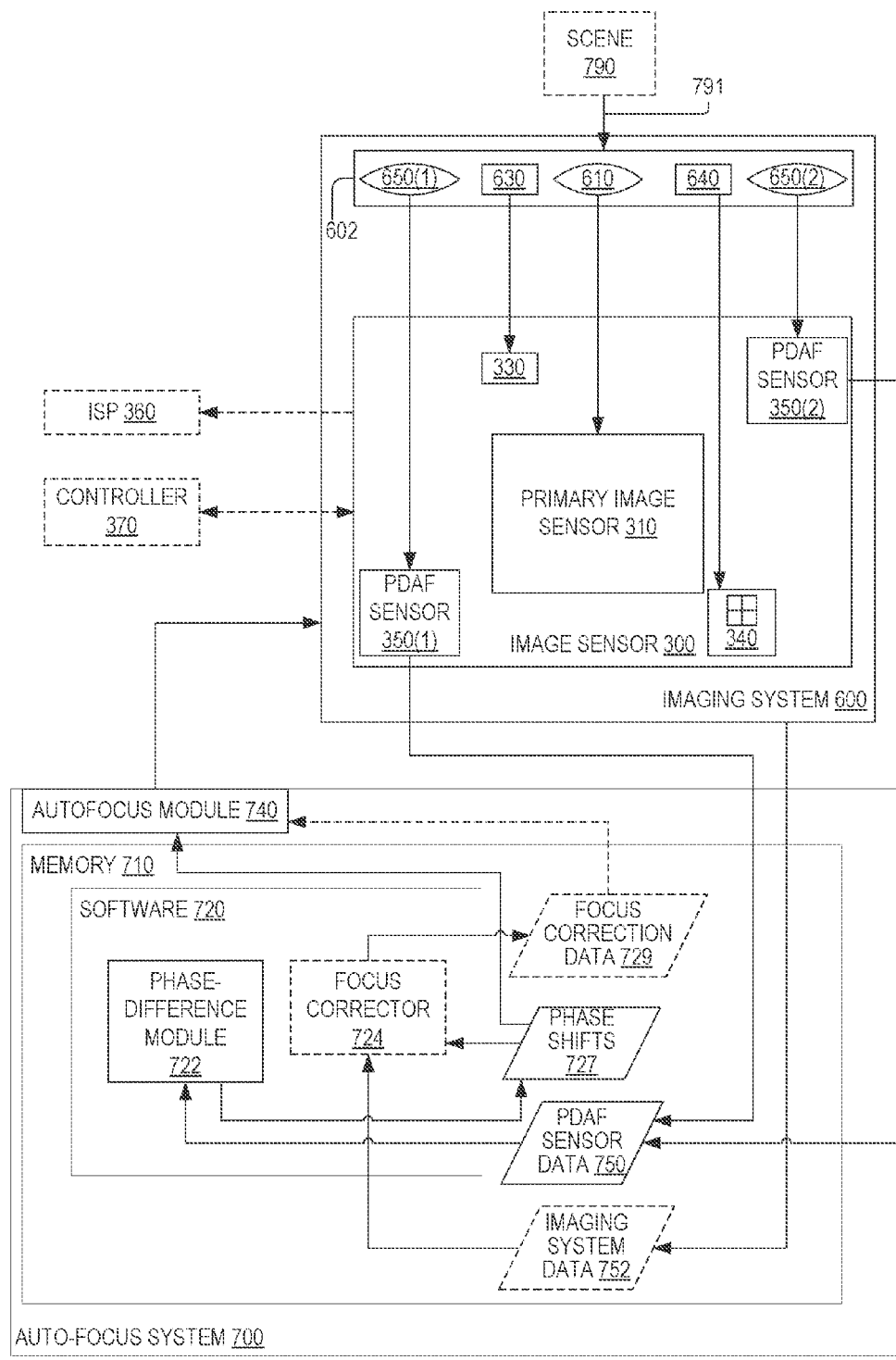
FIG. 7 illustrates an auto-focus system connected to the FIG. 6 imaging system, in an embodiment.

FIG. 7 illustrates one exemplary auto-focus system 700 connected to imaging system 600. Auto-focus system 700 includes software 720 and an autofocus module 740. Software 720 includes and a phase-difference module 722. Auto-focus system 700 may be part of imaging system 600, for example, by being enclosed in a common package.

Lens region 602 of imaging system 600 receives light 791 from a scene 790 in the field of view of lenses 610, 650(1), and 650(2). Diffusers 630 and 640 transmit a portion of light 791 onto sensors 330 and 340, respectively. Lenses 610, 650(1), and 650(2) image scene 790 onto primary image sensor 310, PDAF sensor 350(1), and PDAF sensor 350(2), respectively.

Memory 710 receives stores image data from PDAF sensors 350(1) and 350(2) and stores the data as PDAF sensor data 750. Phase processing module 722 processes PDAF sensor data 750 to determine respective phase shifts 727. Autofocus module 740 receives phase shifts 727 and based on this data adjusts distances 613 and 653. For example, autofocus module 740 adjusts distances 653 to minimize phase shifts 727. When each of lenses 610 and lenses 650 are coplanar and have the same focal length, then an optimal value of distance 653 corresponds to a minimum value of phase shifts 727. This minimum phase-shift value corresponds to a value of distance 613 that enables lens 610 to form a focused image on primary image sensor 310.

In an embodiment, memory 710 also includes a focus corrector 724 and imaging system data 752. Focus corrector 724 uses phase shifts 727 and imaging system data 752 to compute focus correction data 729. Focus correction data 729 includes for example distance adjustments for one or more of lenses 610 and 650. Imaging system data 752 includes data about imaging system 600, such as (a) focal lengths of lenses 610 and 650 and/or (b) current values of distances 613 and 653.

Imaging system data 752 may also include data, such as a look-up table or parameters usable an in algorithm, to derive focus correction data 729 from phase shifts 727. For a given hardware configuration of imaging system 600, for example, imaging system 600 may be calibrated to generate a look-up table, or algorithm derived therefrom, that maps phase shifts 727 to a distance adjustment of lens 610.

Figure 8:
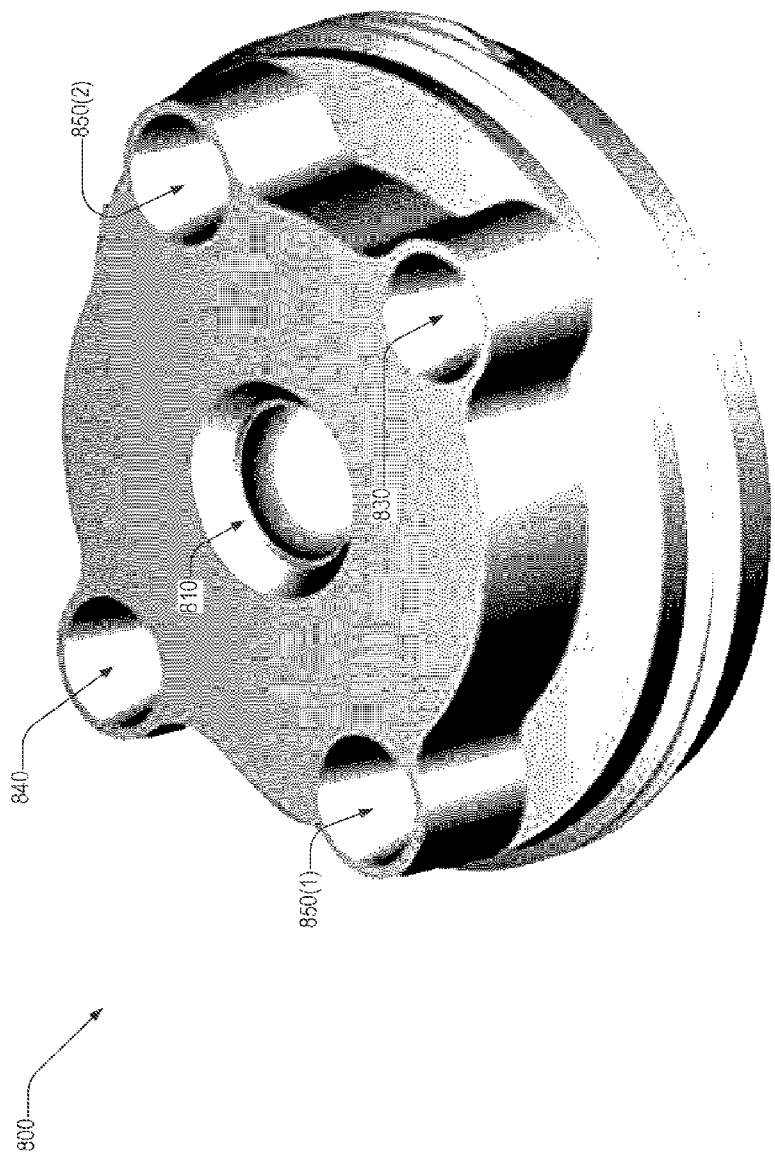
FIG. 8 is a perspective view of an imaging lens mount that holds transmissive elements of the imaging system of FIG. 6, in an embodiment.

FIG. 8 is a perspective view of an imaging lens mount 800 that holds transmissive elements of lens region 602. Lens mount 800 includes mounting apertures 810, 830, 840, 850(1), and 850(2), into which primary imaging lens 610, diffuser 630, diffuser 640, peripheral imaging lens 650(1) and peripheral imaging lens 650(2) may be mounted, respectively. Lens mount 800 may be formed of metal, plastic, or any other suitable material or combination of materials for mounting optical components.

Figure 9:
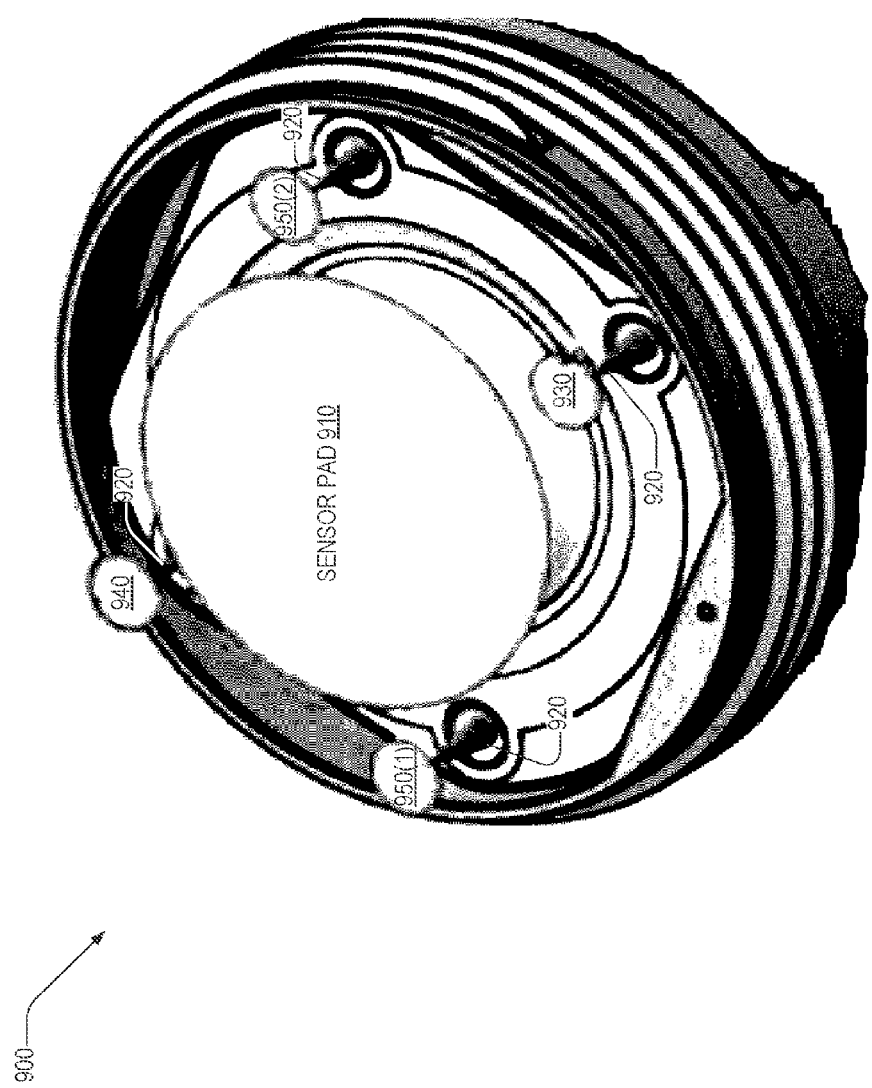
FIG. 9 is a perspective view of a sensor mount that holds sensor elements of FIG. 3 imaging sensor, in an embodiment.

FIG. 9 is a perspective view of a sensor mount 900 that holds sensor elements of image sensor 300. Sensor mount 900 includes sensor pads 910, 930, 940, 950(1), and 950(2), onto which sensors 310, 330, 340, 350(1), and 350(2) may be mounted respectively. In an embodiment, a mounted imaging system includes imaging system 600 and mounts 800 and 900, in which mounts 800 and 900 are designed to connect such that mounting apertures 810, 830, 840, 850(1), and 850(2) align with sensor pads sensor pads 910, 930, 940, 950(1), and 950(2), respectively.

Sensor pads 930, 940, and 950 are each on a respective pedestal 920. Each pedestal 920 may include a channel therein that enable electrical connection of sensors 310, 330, 340, and 350 to data processing components such as control circuitry 319, ISP 360, controller 370, and auto-focus system 700.

Combinations of Features

Features described above as well as those claimed below may be combined in various ways without departing from the scope hereof. The following examples illustrate some possible, non-limiting combinations:

(A1) An image sensor includes a primary pixel array, control circuitry communicatively coupled to the primary pixel array, and a 3A-control sensor. The 3A-control sensor is separate from the primary pixel array and is communicatively connected to the control circuitry to provide at least one of auto-white balance and exposure control for the primary pixel array.

(A2) The image sensor denoted by (A1) may further include a first color filter array aligned to the primary pixel array and including a first plurality of color filters having a respective first plurality of transmission spectra, in which the 3A-control sensor is a pixel-array sensor communicatively coupled to the control circuitry and has (i) a pixel array and (ii) a second color filter array aligned to the pixel array. The second color filter array includes a second plurality of color filters having respective transmission spectra corresponding to the first plurality of transmission spectra.

(A3) In an image sensor denoted by one of (A1) and (A2), the pixel-array sensor may include a pixel that is structurally identical to a pixel of the primary pixel array.

(A4) In an image sensor denoted by one of (A1) through (A3), the primary pixel array and the 3A-control sensor may be formed on a same substrate.

(A5) An image sensor denoted by one of (A1) through (A4) may further include an image sensor package that includes the primary pixel array and the 3A-control sensor.

(A6) In an image sensor denoted by one of (A1) through (A5), the primary pixel array and the 3A-control sensor may be coplanar.

(A7) An image sensor denoted by one of (A1) through (A6) may further include a phase-difference auto-focus (PDAF) sensor separate from the primary pixel array and in a plane parallel to the primary pixel array.

(B1) An image sensor includes a primary pixel array, control circuitry communicatively coupled to the primary pixel array, and a PDAF sensor separate from the primary pixel array and in a plane parallel to the primary pixel array.

(B2) In the image sensor denoted by (B1), the PDAF sensor may include a plurality of pixels and a microlens at least partially above each of the plurality of pixels.

(B3) An image sensor denoted by one of (B1) and (B2) may further include a 3A-control sensor separate from the primary pixel array and communicatively connected to the control circuitry to provide at least one of auto-white balance and exposure control for the primary pixel array.

(C1) An imaging system includes a primary imager and plurality of 3A-control sensors. The primary imager has a first field of view and includes a primary image sensor and a primary imaging lens with a first optical axis. The primary image sensor has a primary pixel array in a first plane, and control circuitry communicatively coupled to the primary pixel array. The plurality of 3A-control sensors includes at least one of a peripheral imager and a 3A-control sensor. The peripheral imager, if included, has (i) a second field of view including at least part of the first field of view and (ii) a phase-difference auto-focus (PDAF) sensor and a peripheral imaging lens. The PDAF sensor is separate from the primary image sensor and in a plane parallel to the first plane. The peripheral imaging lens has a second optical axis parallel to the first optical axis. The 3A-control sensor, if included, is separate from the primary pixel array and is communicatively connected to the control circuitry to provide one of auto-white balance and exposure control for the primary pixel array.

(C2) The imaging system denoted by (C1) may further include a first color filter array aligned to the primary pixel array and including a first plurality of color filters having a respective first plurality of transmission spectra, in which the 3A-control sensor is a pixel-array sensor communicatively coupled to the control circuitry. The pixel-array sensor has (i) a second pixel array and (ii) a second color filter array aligned to the second pixel array. The second color filter array includes a second plurality of color filters having respective transmission spectra corresponding to the first plurality of transmission spectra.

(C3) In the imaging system denoted by (C2), the pixel-array sensor may include a pixel that is structurally identical to a pixel of the primary pixel array.

(C4) An imaging system denoted by one of (C1) through (C3) that includes the peripheral imager may also include an auto-focus system communicatively coupled thereto that is capable of adjusting a distance between the primary imaging lens and the primary image sensor based on an output of the PDAF sensor.

(C5) In an imaging system denoted by one of (C1) through (C4) that includes the peripheral imager, at least one of the following conditions may apply: (a) the primary imaging lens and the peripheral imaging lens are coplanar and (b) the primary imaging lens and the peripheral imaging lens have the same focal length.

(C6) In an imaging system denoted by one of (C1) through (C5) that includes the peripheral imager, the PDAF sensor may include a plurality of pixels and a microlens at least partially above each of the plurality of pixels.

(C7) In an imaging system denoted by one of (C1) through (C6), the primary image sensor and at least one of the 3A-control sensor and the peripheral imager may be formed on a same substrate.

(C8) An imaging system denoted by one of (C1) through (C7), may further include an image sensor package that includes the primary image sensor and at least one of the 3A-control sensor and the peripheral imager.

Changes may be made in the above methods and systems without departing from the scope hereof. It should thus be noted that the matter contained in the above description or shown in the accompanying drawings should be interpreted as illustrative and not in a limiting sense. The following claims are intended to cover all generic and specific features described herein, as well as all statements of the scope of the present method and system, which, as a matter of language, might be said to fall therebetween.

What is claimed is:

1. An image sensor comprising:
a primary pixel array;
control circuitry communicatively coupled to the primary pixel array;
a first color filter array aligned to the primary pixel array and including a first plurality of color filters having a respective first plurality of transmission spectra;
a peripheral sensor, spatially separated from the primary pixel array, located in a peripheral sensor region surrounding the primary pixel array, and communicatively connected to the control circuitry to provide exposure control for the primary pixel array;
a transmissive diffuser aligned with the peripheral sensor; and
the peripheral sensor being a pixel-array sensor communicatively coupled to the control circuitry and having (i) a pixel array and (ii) a second color filter array aligned to the pixel array and including a second plurality of color filters having respective transmission spectra corresponding to the first plurality of transmission spectra.

2. The image sensor of claim 1, the pixel-array sensor including a pixel that is structurally identical to a pixel of the primary pixel array.

3. The image sensor of claim 1, the primary pixel array and the peripheral sensor being formed on a same substrate.

4. The image sensor of claim 1, further comprising a phase-difference auto-focus (PDAF) sensor separate from the primary pixel array and in a plane parallel to the primary pixel array.

5. The image sensor of claim 1, the peripheral sensor being an infrared sensor having an infrared transmission filter thereon.

6. The image sensor of claim 1, the peripheral sensor being configured to detect light incident thereon from a region thereabove, no part of any lens wider than the peripheral sensor being directly above the peripheral sensor.

7. An image sensor comprising:
a primary pixel array;
control circuitry communicatively coupled to the primary pixel array; and
a phase-difference auto-focus (PDAF) sensor spatially separated from the primary pixel array, located in a peripheral region surrounding the primary pixel array, and in a plane parallel to the primary pixel array, the PDAF sensor including:
a plurality of pixels including a first pixel and a second pixel directly adjacent thereto;
a microlens at least partially above each of the plurality of pixels;
a first color filter between the microlens and the first pixel, and having a first transmission spectrum; and
a second color filter, directly adjacent to the first color filter, between the microlens and the second pixel, and having a second transmission spectrum differing from the first transmission spectrum.

8. The image sensor of claim 7, further comprising a peripheral sensor separate from the primary pixel array and communicatively connected to the control circuitry to provide at least one of auto-white balance and exposure control for the primary pixel array.

9. The image sensor of claim 8, further comprising a transmissive diffuser aligned with the peripheral sensor.

10. The image sensor of claim 9, the peripheral sensor being an infrared sensor having an infrared transmission filter thereon.

11. The image sensor of claim 9, the peripheral sensor being configured to detect light incident thereon from a region thereabove, no part of any lens wider than the peripheral sensor being directly above the peripheral sensor.

12. An imaging system comprising:
a primary imager having a first field of view and including a primary image sensor and a primary imaging lens with a first optical axis;
the primary image sensor having a primary pixel array in a first plane, and control circuitry communicatively coupled to the primary pixel array;
a plurality of peripheral sensors, each spatially separated from the primary pixel array and located in a peripheral sensor region surrounding the primary pixel array, the plurality of peripheral sensors including
(a) a peripheral imager having a second field of view including (i) at least part of the first field of view and (ii) a phase-difference auto-focus (PDAF) sensor and a peripheral imaging lens, the PDAF sensor being in a plane parallel to the first plane, the peripheral imaging lens having a second optical axis parallel to the first optical axis, and (b) an optical sensor communicatively connected to the control circuitry to provide exposure control for the primary pixel array and aligned with a transmissive diffuser.

13. The imaging system of claim 12, further comprising:
a first color filter array aligned to the primary pixel array and including a first plurality of color filters having a respective first plurality of transmission spectra,
the peripheral sensor being a pixel-array sensor communicatively coupled to the control circuitry and having (i) a second pixel array and (ii) a second color filter array aligned to the second pixel array and including a second plurality of color filters having respective transmission spectra corresponding to the first plurality of transmission spectra.

14. The imaging system of claim 13, the second pixel array including a pixel that is structurally identical to a pixel of the primary pixel array.

15. The imaging system of claim 12 including an auto-focus system, communicatively coupled to the peripheral imager, that is capable of adjusting a distance between the primary imaging lens and the primary image sensor based on an output of the PDAF sensor.

16. The imaging system of claim 12, at least one of (a) the primary imaging lens and the peripheral imaging lens being coplanar and (b) the primary imaging lens and the peripheral imaging lens having the same focal length.

17. The imaging system of claim 12, the PDAF sensor including a plurality of pixels and a microlens at least partially above each of the plurality of pixels.

18. The imaging system of claim 12, the primary image sensor and at least one of the peripheral sensor and the peripheral imager being formed on a same substrate.

19. The imaging system of claim 12, the optical sensor being an infrared sensor having an infrared transmission filter thereon.

20. The imaging system of claim 12, the optical sensor being configured to detect light incident thereon from a region thereabove, no part of either the primary imaging lens or any lens wider than the optical sensor being directly above the optical sensor.

* * * * *